(12) United States Patent
Bull et al.

(10) Patent No.: US 8,471,612 B1
(45) Date of Patent: Jun. 25, 2013

(54) SIGNAL VALUE STORAGE CIRCUITRY WITH TRANSITION ERROR DETECTOR

(75) Inventors: David Michael Bull, Cambridge (GB); Shidhartha Das, Norwich (GB)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 13/545,518

(22) Filed: Jul. 10, 2012

(51) Int. Cl.
H03L 7/06 (2006.01)

(52) U.S. Cl.
USPC .......................................... 327/156; 327/147

(58) Field of Classification Search
USPC .................................................. 327/147, 156
See application file for complete search history.

(56) References Cited

U.S. PATENT DOCUMENTS

| | | | |
|---|---|---|---|
| 7,720,188 B2 * | 5/2010 | Sanduleanu et al. | 375/374 |
| 7,957,500 B2 * | 6/2011 | Sanduleanu et al. | 375/374 |
| 8,139,704 B2 * | 3/2012 | Heinrich | 375/376 |
| 8,185,812 B2 * | 5/2012 | Das et al. | 714/814 |
| 8,301,970 B2 * | 10/2012 | Bowman et al. | 714/758 |
| 2001/0052807 A1 * | 12/2001 | Vaucher | 327/157 |
| 2006/0017477 A1 * | 1/2006 | Miki et al. | 327/157 |
| 2007/0162798 A1 * | 7/2007 | Das et al. | 714/724 |
| 2008/0238489 A1 * | 10/2008 | Sanduleanu et al. | 327/42 |
| 2009/0115472 A1 * | 5/2009 | Pfaff et al. | 327/156 |
| 2012/0163519 A1 * | 6/2012 | Choudhury | 375/354 |
| 2012/0235716 A1 * | 9/2012 | Dubost et al. | 327/147 |
| 2013/0002298 A1 * | 1/2013 | Howard et al. | 326/56 |

OTHER PUBLICATIONS

Bull, et al., "A Power-Efficient 32b ARM ISA Processor Using Timing-Error Detection and Correction for Transient-Error Tolerance an dAdaptation to PVT Variation", ISSCC (2010), 3 pages.
Bowman et al., "Energy Efficient and Metastability-Immune Timing-Error Detection and Instruction-Replay-Based Recovery Circuits for Dynamic-Variation Tolerance", ISSCC, (2010), 3 pages.
Blaauw, et al., "Razor II: In Situ Error Detection and Correction for PVT and SER Tolerance", ISSCC, (2008), 3 pages.
Tschanz, et al., "A 45nm Resilient and Adaptive Microprocessor Core for Dynamic Variation Tolerance", ISSCC, (2008), 3 pages.
U.S. Appl. No. 13/067,886, filed Jul. 1, 2011, in the name of Shidhartha Das et al.

* cited by examiner

Primary Examiner — Adam Houston
(74) Attorney, Agent, or Firm — Nixon & Vanderhye

(57) ABSTRACT

Signal value storage circuitry 2 includes transparent storage circuitry 4, transition detector circuitry 6 and error detecting circuitry 8. The transition detector circuitry serves to generate a detection pulse when a signal transition is detected at a signal node NS within the transparent storage circuitry. The error detecting circuitry generates an error indicating signal when this detection pulse overlaps in time with the non-transparent phase of a pulse clock signal controlling the signal valve storage circuitry for at least an overlap period $T_{OV}$.

18 Claims, 5 Drawing Sheets

"SIGNAL VALUE STORAGE CIRCUITRY WITH TRANSITION ERROR DETECTOR

BACKGROUND OF THE INVENTION

1. Field of the Invention

This invention relates to the field of data processing systems. More particularly, this invention relates to signal value storage circuitry incorporating transition error detecting mechanisms for use within data processing systems.

2. Description of the Prior Art

It is known to provide data processing systems including signal storage circuitry. This storage circuitry could take a wide variety of different forms, such as master/slave latches, flip-flops, registers and alike. Such signal value storage circuitry is used to capture and store state within the data processing system. These stored signals may represent data or control information. Signal values typically propagate between signal value storage circuitry and pass through processing circuitry disposed between these instances of signal value storage circuitry. A clock signal is used to regulate the passing of signal values between the signal value storage circuitry.

It is known from WO-A-2004/084072 to provide signal value storage circuitry including error detection circuitry which detects whether or not the signal value stored in that signal value storage circuitry was captured too early and accordingly does not represent the true signal value which should have been captured and passed on to subsequent processing circuitry. If an error is detected in this way, then error correction mechanisms are triggered and corrective action(s) taken.

FIG. 1 of the accompanying drawings schematically illustrates an example of a clock signal used for regulating capture of a signal value into signal value storage circuitry. The signal value is captured at rising edge of the clock signal. If a transition in the signal value that is to be captured arrives at the signal valve storage circuitry before the rising edge, then the correct signal value will be captured at the rising edge and no error occurs. However, if the transition in the signal does not arrive until after the rising edge in the clock signal, then an incorrect value will have been captured at that rising edge and an error will have occurred. An error detection window constituting a time after the rising edge of the clock signal is provided and any transitions within the signal arriving at the signal value storage circuitry occurring within this error detection window indicate a late arriving signal and that an error has occurred. It will be appreciated that the error detection window cannot grow too large otherwise it might incorrectly identify the arrival of a correct subsequent signal value at the signal value storage circuitry as a late transition in the preceding signal value.

The error detection window is triggered relative to the rising edge of the clock which controls the storage of the signal value into the signal value storage circuitry. One requirement of the transition detection circuit is that any transition (including glitches) which could cause either an incorrect state value to be latched, or metastability, is flagged as an error. This has the consequence that the error transition circuits satisfy constraints relating to both sensitivity (in order to to be able to react to glitches), and minimum delay (in order to be able to guarantee that the effective timing error detection window always covers the setup time of the storage circuit). If the delay of the transition circuit is more than the minimum required, then the error detection becomes pessimistic, and signal transitions which occur before the setup time of the storage element can still be flagged as errors. As process geometry for forming integrated circuits decrease in size, it becomes increasingly difficult to provide transition detection circuitry which satisfies both sensitivity and uniform delay constraints.

One technique, which can somewhat alleviate these design constraints, is to generate a time shifted version of the clock signal, and use this to control the action of the transition detection circuit. This has the effect of allowing more delay in the transition circuit without increasing pessimism, which in turn allows different tradeoffs for sensitivity and delay uniformity. However, there is a power consumption penalty involved in providing such a time shifted clock signal for the purpose of controlling the transition detection circuitry and this renders this possibly unattractive.

SUMMARY OF THE INVENTION

Viewed from one aspect the present invention provides signal value storage circuitry comprising:

transparent storage circuitry having a signal input and a signal output, said transparent storage circuit controlled by a pulse clock signal:

(i) during a transparent phase of said pulse clock signal, to transmit a transition in a signal received at said signal input to said signal output via a signal node; and (ii) during a non-transparent phase of said pulse clock signal, to block transmission of said transition of said signal through said signal input while maintaining a previously captured signal value at said signal output;

transition detector circuitry coupled to said signal node within said transparent storage circuitry and configured to generate a detection pulse with a detection pulse width $T_{PW}$ when a signal transition is detected at said signal node; and error detecting circuitry coupled to said transition detecting circuitry and configured to generate an error indicating signal when said detection pulse overlaps in time with said non-transparent phase for at least an overlap period $T_{OV}$.

The present technique recognises that by providing the signal value storage circuitry in a form using transparent storage circuitry controlled by a pulse clock signal, late transition error detection may be provided in a way which at least partially avoids some of the above described advantages. More particularly, capture of the signal by the transparent storage circuitry is started at the start of the transparent phase of the pulse clock signal and the error detection window is controlled based upon the end of the transparent phase (e.g. a start of the non-transparent phase). In this way, the delay in operation of the transition detecting circuitry can be accommodated within the transparent phase without extending beyond the start of the transparent phase and thus producing overly pessimistic transition error detecting. Furthermore, the error detection window need not start at the beginning of the transparent phase and thus transitions which occur within a first portion of the transparent phase may be tolerated (at least in the action of the initial signal value storage circuitry) as they will propagate through to the signal output and have not occurred so late as to fall within the error detection window defined by an overlap of the detection pulse with the non-transparent phase.

It will be appreciated that the detection pulse width is not necessarily a constant. The detection pulse width may depend on the nature of the late transition that arises. In a similar way, the overlap period need not be constant and may be dependent upon the particular circumstances surrounding the late transition being detected.

Using a pulse clock signal and the trailing edge of the pulse clock signal to define the end of the error detection window has the result of imposing a constraint upon a minimum duration of the transparent phase of the clock signal. In particular, the transparent phase should have a duration equal to or greater than sum of the delay between the transition in the signal passing through the signal input and the start of the detection pulse with the pulse width, less the overlap period.

As previously mentioned, the present technique may tolerate late transitions occurring in the first part of the transparent phase which may be considered to be a leading dead period. This leading dead period may have a duration equal to a difference between the duration of the transparent phase and the minimum duration of the transparent phase as discussed above.

The transparent storage circuitry can take a variety of different forms. One example form comprises a transmission gate disposed at the signal input and switched between a transmissive state and a non-transmissive state by the pulse clock signal. In this context, one form of the transparent storage circuitry may include inverter feedback circuitry between the signal input and signal output and configured to store the signal received through the signal input and to generate the signal output.

The transition detector circuitry used to detect errors within the error detection window can be formed in a variety of different ways. In some embodiments the transition detector circuitry may comprise separate rising edge detector circuitry and falling edge detector circuitry both coupled to the signal node within the signal storage circuitry at which transitions are to be detected.

While it will be appreciated that there is some variation permitted within the duty cycle of the pulse clock signal, in some embodiments the transparent phase is less in duration and the non-transparent phase. If the transparent phase becomes too long, then problems can arise due to race conditions in which an early arriving subsequent signal causes an inappropriate transition in a previous signal value.

Error detection circuitry can also take a variety of forms. In one example form, an error signal node is pre-charged to a first level and the error detection circuitry discharges this error signal node to a second level while the detection pulse is being received from the transition detection circuitry during a time corresponding to the non-transparent phase of the pulse clock signal.

In the above context the overlap period may correspond to a time taken for the error signal node to discharge from the first level toward the second level sufficiently to generate the error indicating signal. It will take a finite time of the required amount of charge to be discharged and accordingly the overlap between the detection pulse and the non-transparent phase should at least last for this time in order that an error signal be generated.

It will be appreciated that a signal storage circuitry described above may be beneficially used in context of an integrated circuit that includes error recovery circuitry configured to respond to the error indicating signal to correct an error generated as a consequence for late transition in the signal received at the signal input.

Integrated circuit may additionally comprise controller circuitry configured to control one or more operating parameters of the integrated circuit, such as operating voltage or operating frequency, so as to maintain a non-zero rate of occurrence of the error indicating signal. In this way, the gains made by operating at a marginally operative voltage and/or frequency may compensate for the time and overhead associated with correcting errors when the do arise.

Such an integrated circuit as described above will typically operate using a main clock signal generated by main clock signal generating circuitry and having a main duty ratio of substantially 50%. Such a balanced clock is generally beneficial in regulating the operation of an integrated circuit. When such main clock generating circuitry is provided, some embodiments may also provide pulse clock generating circuitry that is coupled to the main clock generating circuitry and configured to generate the pulse clock signal to be synchronous with the main clock signal and to have a pulse duty ratio such that the transparent phase has a duration which is less than the non-transparent phase.

The pulse duty ratio may be varied. As an example, training circuitry may be provided which operates, (such as at boot) to start from a value of the duration of the transparent phase that is less than a minimum value, and that results in transitions in the signal occurring immediately proceeding the start of the transparent phase being detected as false errors and then increase from this duration of the transparent phase to a duty ratio to be used in operation at which such pulse errors no longer arise. In this way, the pulse duty ratio may be tuned to an individual instance of an integrated circuit or an individual type of integrated circuit.

Clock tree circuitry may be used to distribute the main clock signal through the integrated circuit and in this context the pulse clock generating circuitry may be coupled to the clock tree circuitry and configured to generate a pulse clock signal that is used by signal storage circuitry that is nearby the pulse clock generating circuitry.

The pulse clock generating circuitry may be conveniently combined with clock gating circuitry for stopping the main clock signal as may be desired in some embodiments.

Viewed from another aspect the present invention provides signal value storage circuitry comprising:
transparent storage means for storing a signal and having a signal input and a signal output, said transparent storage means controlled by a pulse clock signal:
  (i) during a transparent phase of said pulse clock signal, to transmit a transition in a signal received at said signal input to said signal output via a signal node; and
  (ii) during a non-transparent phase of said pulse clock signal, to block transmission of said transition of said signal through said signal input while maintaining a previously captured signal value at said signal output;
transition detector means, coupled to said signal node within said transparent storage means, for generating a detection pulse with a detection pulse width $T_{PW}$ when a signal transition is detected at said signal node; and
error detecting means, coupled to said transition detecting means, for generating an error indicating signal when said detection pulse overlaps in time with said non-transparent phase for at least an overlap period $T_{OV}$.

Viewed from a further aspect the present invention provides a method of storing a signal value comprising the steps of:
storing a signal within transparent storage circuitry having a signal input and a signal output, said transparent storage means controlled by a pulse clock signal:
  (i) during a transparent phase of said pulse clock signal, to transmit a transition in said signal received at said signal input to said signal output via a signal node; and
  (ii) during a non-transparent phase of said pulse clock signal, to block transmission of said transition of said signal through said signal input while maintaining a previously captured signal value at said signal output;
generating a detection pulse with a detection pulse width $T_{PW}$ when a signal transition is detected at said signal node; and generating an error indicating signal when said detection pulse overlaps in time with said non-transparent phase for at least an overlap period $T_{OV}$.

Embodiments of the invention will now be described by way of example only, with reference to the accompanying drawings in which:

The above, and other objects, features and advantages of this invention will be apparent from the following detailed description of illustrative embodiments which is to be read in connection with the accompanying drawings.

DESCRIPTION OF THE EMBODIMENTS

Figure 1:
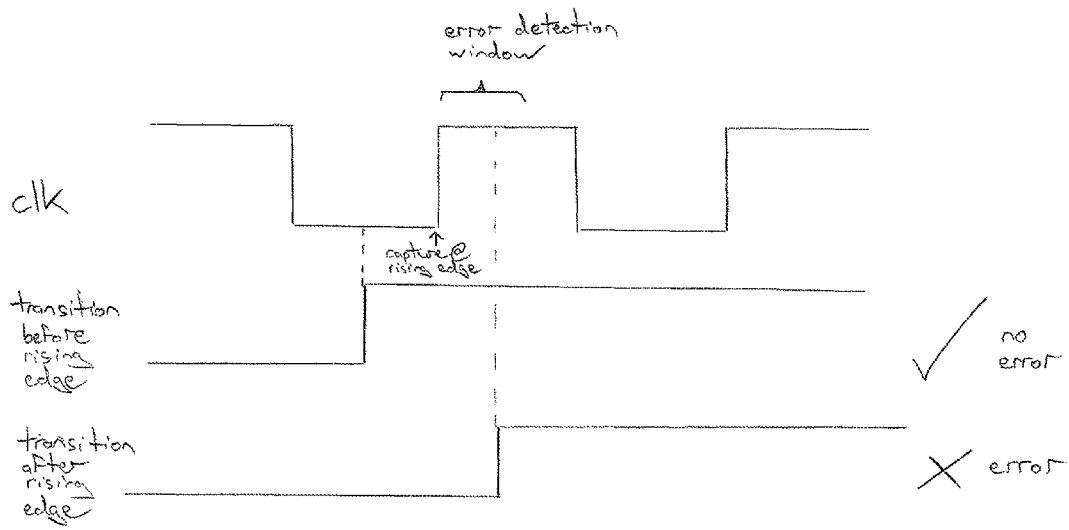
FIG. 1 schematically illustrates an example of the relationship between a main clock signal and an error detection window used in signal value storage circuitry.
Figure 2:
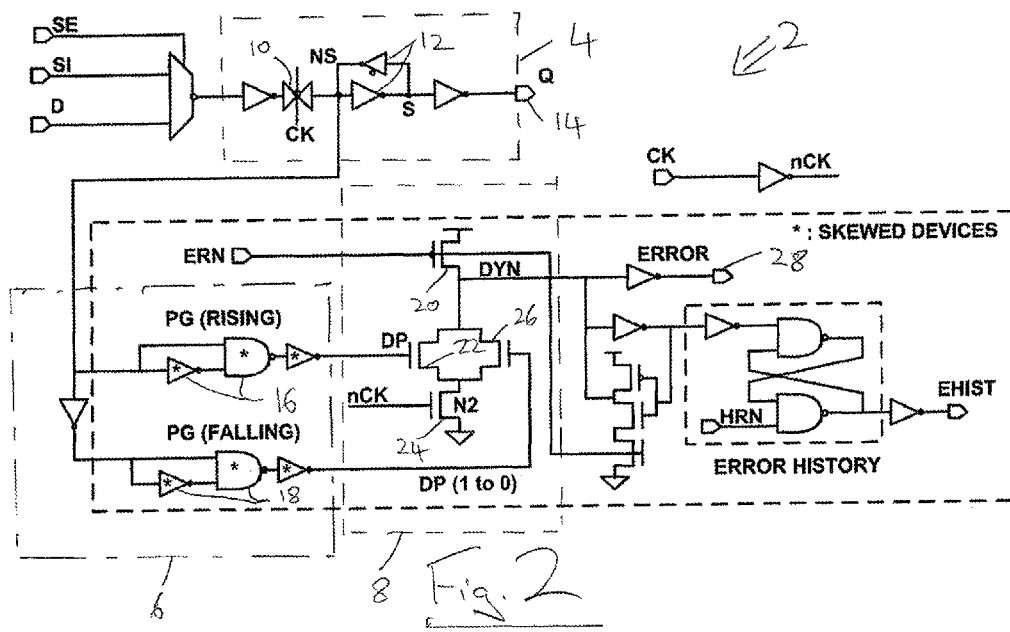
FIG. 2 schematically illustrates an example signal value storage circuitry including transparent storage circuitry, transition detection circuitry and error detecting circuitry.

FIG. 2 schematically illustrates signal value storage circuitry 2 including transparent storage circuitry 4, transition detector circuitry 6 and error detecting circuitry 8. The transparent storage circuitry 4 includes a transmission gate 10 which is switched to a transmissive state by the transparent phase of the pulse clock signal CK and is switched to a non-transmissive state by the non-transparent phase of the pulse clock signal CK. The transmission gate 10 is disposed at the signal input of the transparent storage circuitry 4. Inverter feedback circuitry 12 is disposed between the transmission gate 10 and a signal output 14. The inverter feedback circuitry 12 serves to store a signal received through the transmission gate 10 and to generate a signal that is output from the signal output 14. A signal node NS at the signal input side of the inverter feedback circuitry 12 is monitored by the transition detector circuitry 6.

The transition detector circuitry 6 includes rising edge detector circuitry 16 and falling edge detector circuitry 18. The action of the transition detector circuitry 6 is to generate a detection pulse with a pulse width $T_{PW}$ whenever either a rising edge or falling edge within the signal at the signal node NS is detected. It will be appreciated that the detection pulse width $T_{PW}$ is not necessarily a constant and a vary in dependence upon the characteristics upon the transition detected at the signal node NS.

The error detecting circuitry 8 includes an error signal node DYN that is pre-charged to a high voltage level through transistor 20 in response to an error reset signal ERN. This error signal node DYN may be discharged through a path through transistors 22 and 24 when the detection pulse for a rising edge overlaps with the non-transparent phase of the pulse clock signal or through transistors 26, 24 when the detection pulse from a falling edge overlaps the non-transparent phase of the pulse clock signal. When the error signal node DYN is discharged, then an error indicating signal is generated at the error output 28.

The error history circuitry illustrated within FIG. 2 serves to record the occurrence of an error indicating signal across resets of the error signal node.

Figure 3:
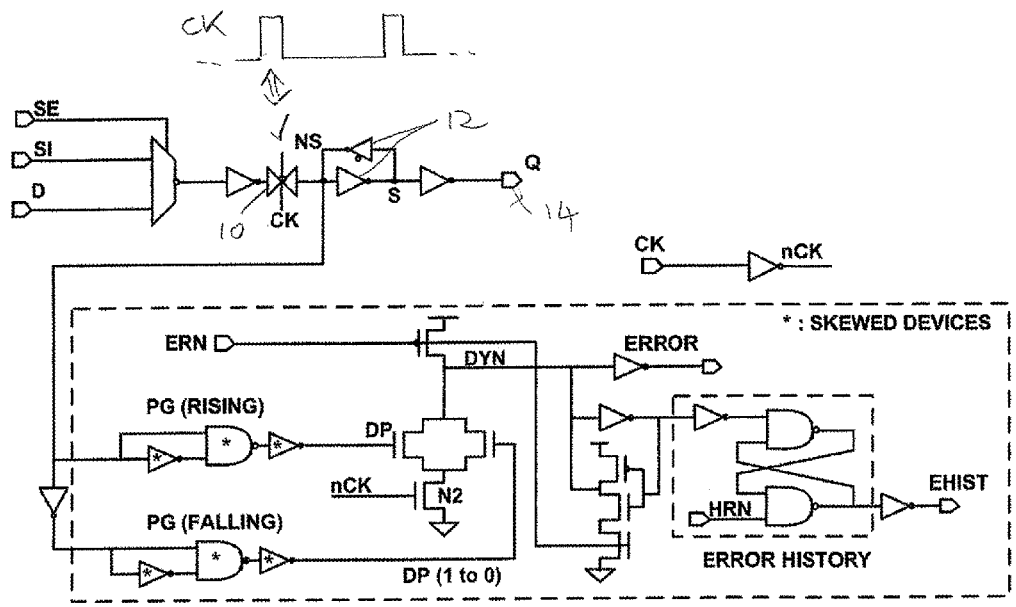
FIG. 3 schematically illustrates the action of transparent storage circuitry in capturing a signal value in response to a pulse clock signal.

FIG. 3 schematically illustrates the action of the transparent storage circuitry 4 in capturing a signal input to the transparent storage circuitry 4. During the high (transparent) phase of the pulse clock signal CK, the transmission gate 10 is open and a signal input at D propagates through the transmission gate 10 to the signal node NS and forces a change of state in the inverter feedback circuitry 12 (if necessary). The captured signal propagates to the signal output 14 as soon as it is captured and in this way the transparent storage circuitry 4 is transparent to the received signal. During the low (non-transparent) phase of the pulse clock signal CK, the transmission gate 10 is closed.

Figure 4:
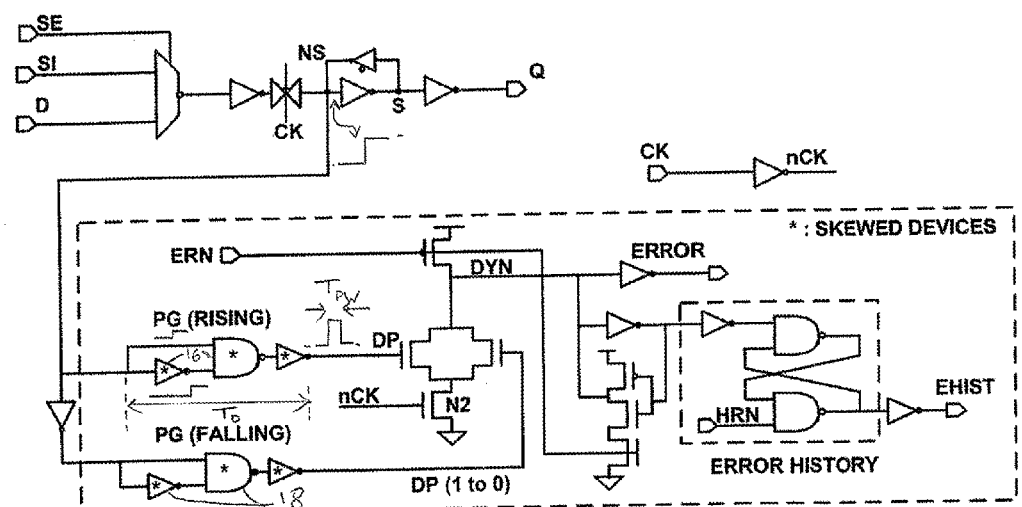
FIG. 4 schematically illustrates the operation of the transition detector circuitry in generating a detection pulse in response to a transition in a signal value at a node within the transparent storage circuitry.

FIG. 4 schematically illustrates the operation of the transition detector circuitry 6 in response to a transition in the signal at the signal node NS. In the example illustrates in FIG. 4, the transition is a rising edge at signal node NS. The rising edge detector circuitry 16 responds to this rising edge by generating a detection pulse with a detection pulse width $T_{PW}$. The rising edge detector circuitry 16 comprises a NAND gate with one input directly connected to the signal node NS and the other input connected to the signal node NS via an inverter which imposes a delay in the transition reaches the NAND gate thereby giving rise to the detection pulse. The rising edge detector circuitry 16 is formed of skewed devices so as to increase its speed and sensitivity to rising edges. The falling edge detector circuitry 18 is formed and operates in a similar way to respond to falling edges at the signal node NS.

Figure 5:
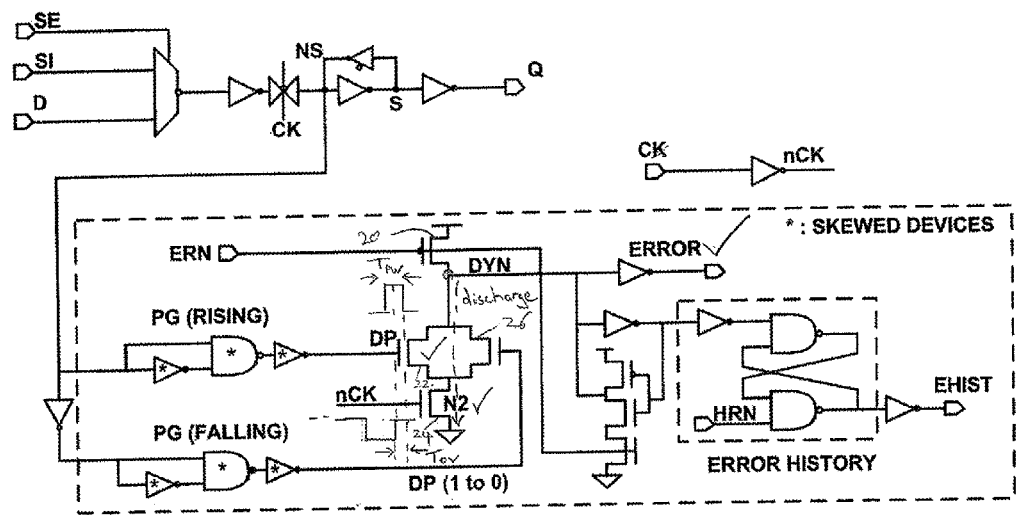
FIG. 5 schematically illustrates the operation of the error detecting circuitry in generating an error indicating signal when the detection pulse overlaps with the non-transparent phase of the pulse clock signal for at least an overlap period.

FIG. 5 schematically illustrates the operation of the error detecting circuitry 8 in response to the detection pulse. The error signal node DYN is pre-charged to a high level via the transistor 20 under control of the error reset signal ERN. This error signal node DYN is discharged when a detection pulse serves to open either transistor 22 or transistor 26 at the same time that the transistor 24 is open during the non-transparent phase of the pulse clock signal. In this way, the error signal node DYN is discharged during the overlap period for which the detection pulse overlaps with the non-transparent phase of the pulse clock signal. When the error signal node DYN is discharged, an error indicating signal ERROR is generated.

The transition detector circuitry 6 has a response delay time $T_D$ corresponding to the delay between a transition passing through the signal input 10 and the start of the detection pulse DP output to the error detecting circuitry 8. In order that signal transitions that arrive at the signal input before the transparent phase of the pulse clock signal started (i.e. transitions corresponding to timely arrival of the signal) should not give rise to the generation of error indicating signal, the detection pulse generated when such valid transition enter the transparent storage circuitry 4 and give rise to a transition at the signal node NS should be given sufficient time to complete prior to the end of the transparent phase so that they do not overlap with the non-transparent phase for a time sufficient to result in a discharge of the error signal node DYN that will give rise to generation of an inappropriate error indicating signal. This consideration is such that the transparent phase should have a duration $T_T$ equal to or greater than $(T_D+T_{PW}-T_{OV})$, where $T_{OV}$ is the overlap period required for the error signal node DYN to be discharged sufficiently to generate an error indicating signal. This requirement corresponds to the transparent phase of the pulse clock signal not being too quick as it will otherwise give rise to false error signals in which timely arriving transitions at the transparent storage circuitry 4 are incorrectly identified as errors.

When the duration of the transparent phase $T_T$ is extended beyond this requirement, then it introduces a leading dead period $T_B$ in the transparent phase during which a transition at the signal node NS will not generate an error signal as the detection pulse DP corresponding to that transition will have finished before the non-transparent phase of the pulse clock signal starts and the transistor 24 opens to permit potential discharge of the error signal node DYN. This leading dead period $T_B$ gives rise to a tolerance to signal transitions during the leading portion of the transparent phase, i.e. these transitions do not give rise to an error indicating signal. This opportunistically permits such late transitions to propagate through the transparent storage circuitry 4 to the next processing stage where there late arrival may or may not be tolerated (may or may not be detected as an error in that subsequent stage). The leading dead period $T_B$ is given by $(T_T-(T_D+T_{PW}-T_{OV}))$.

Figure 6:
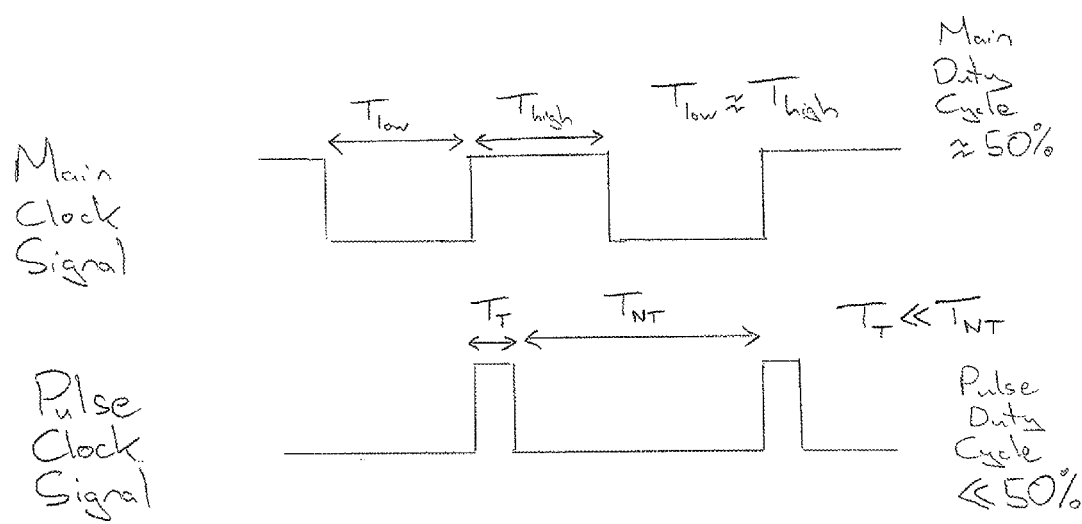
FIG. 6 schematically illustrates a main clock signal and a pulse clock signal derived from the main clock signal.

FIG. 6 schematically illustrates a relationship between a main clock signal and a pulse clock signal that are used within an integrated circuit. The main clock signal has a main duty cycle of approximately 50%. This is a signal that is well suited to the regulation of the processing activity of an integrated circuit. The pulse clock signal may be generated synchronously from the main clock signal. For example, the pulses may be generated in response to detection of rising edges within the main clock signal. The high phase of the pulse clock signal in this example embodiment corresponds to the transparent phase $T_T$. The low phase of the pulse clock signal corresponds to the non-transparent phase $T_{NT}$. The pulse duty cycle is significantly less than 50%.

Figure 7:
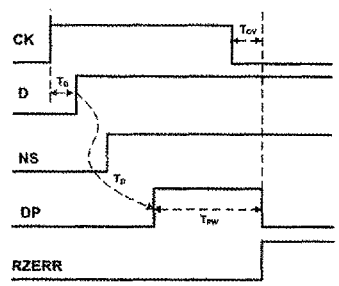
FIG. 7 illustrates example timing diagrams relating to the signal storage circuitry of FIG. 2.

FIG. 7 schematically illustrates timing diagrams that may be used in understanding the principle of operation of the signal storage circuitry of FIG. 2. The pulse clock signal CK is shown with its high state corresponding to the transparent phase. A transition in the signal D at the signal node NS passes through the transmission gate 10, is latched by the feedback circuitry 12 and propagates on transparently to the signal output 14. The transition detector 6 generates the detection pulse DP after a response delay time $T_D$ following the transition in the signal B. The detection pulse has a duration $T_{PW}$. The detection pulse DP overlaps in time with the non-transparent phase of the pulse clock signal by an overlap period $T_{OV}$. This overlap period is sufficient for the error signal node DYN to be discharged and accordingly give rise to the error indicating signal RZERR.

Figure 8:
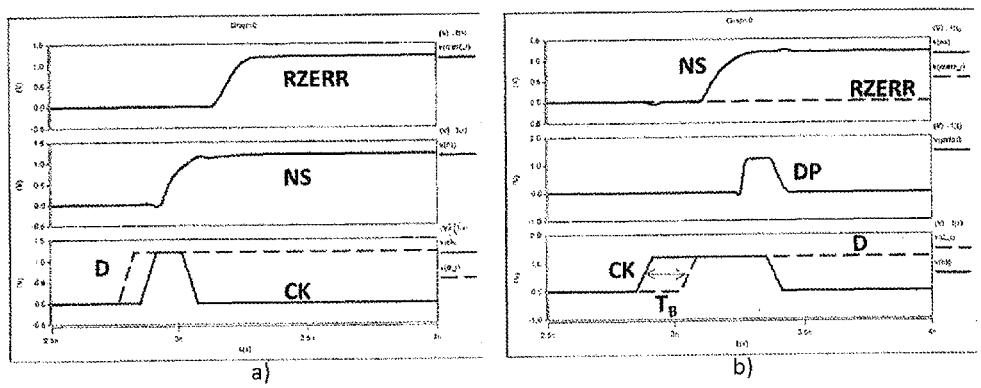
FIG. 8 illustrates the behaviour of the signal storage circuitry of FIG. 2 when the transparent phase is too short and when the transparent phase gives rise to a leading dead period.

FIG. 8 schematically illustrates the behaviour of signal storage circuitry of FIG. 2 when the transparent phase is too short in example (a) and when the transparent phase is sufficiently long to give rise to a leading dead period $T_B$ in example (b). As previously explained, when the transparent phase is too short (the pulse duration of the pulse clock signal is to short), then a valid transition in the signal D which arrives at the transmission gate 10 before the transparent phase starts will nevertheless result in a detection pulse when it enters the transparent storage circuitry 4 that does overlap with the non-transparent phase of the pulse clock signal that starts effectively too soon and accordingly results in generation error indicating signal.

In example (b) of FIG. 8, the transparent phase is sufficiently long that such false error signals do not arise. In fact there is a leading dead period $T_B$. Following the start of the transparent phase during which a late arriving transition into the transparent storage circuitry 4 will not give rise to an error indicating signal as its corresponding detection pulse will have finished before the transparent phase finishes.

Figure 9:
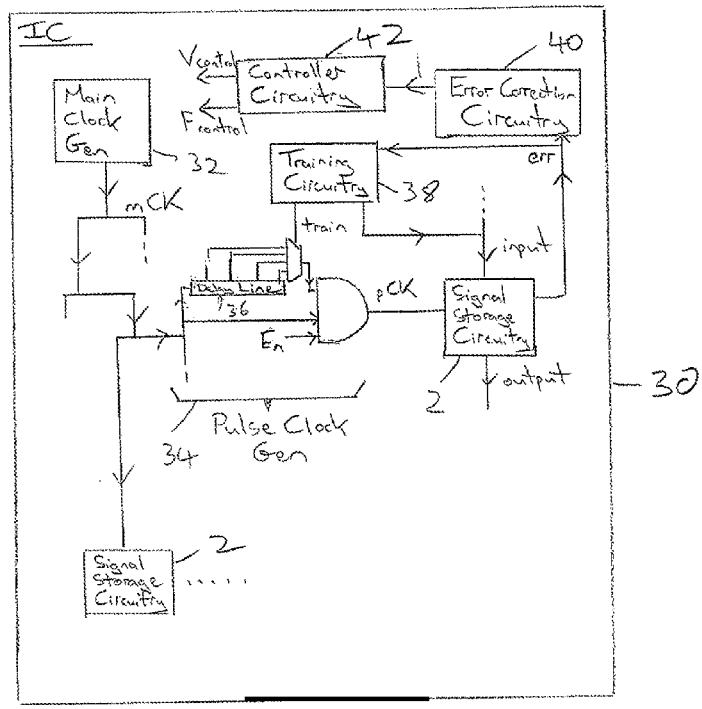
FIG. 9 schematically illustrates the use of the signal storage circuitry of FIG. 2 within an integrated circuit.

FIG. 9 schematically illustrates an integrated circuit 30 including multiple signal value storage circuitry 2 of the type illustrated in FIG. 2. Main clock generating circuitry 32 generates a main clock signal mCK and that is distributed through a clock tree. Pulse clock generating circuitry 34 receives this main clock signal mCK and serves to generate a pulse clock signal pCK that is locally used by signal storage circuitry in accordance with the above described techniques. The pulse clock generating circuitry 34 generates a pulse clock signal pCK that is synchronous with the main clock signal mCK (pCK=(mCK AND (NOT mCK_delayed) AND En). A delay line 36 within the pulse clock generating circuitry 34 is used to vary the high phase (transparent phase) of the pulse clock signal pCK under control of a training signal. The delay line 36 outputs a time delayed and inverted version of the main clock signal MCK. An enable signal En supplied to the pulse clock signal 34 also serves to provide local clock gating for the pulse clock signal pCK supplied to the signal value storage circuitry 2.

Training circuitry 38, upon initialisation of the integrated circuit 30, may serve to perform training operations on the signal value storage circuitry 32 in which transitions are supplied as inputs to the signal value storage circuitry 2 with different transparent phase durations being selected using the delay line 36. In this way, the pulse duty ratio of the pulse clock signal can be started from a value of $T_T$, that is less than the limiting value $(T_D+T_{PW}-T_{OV})$ and that results in false errors as previously discussed, and then increases to a point that the false errors no longer arise. In this way, the training circuitry 38 can adjust the pulse duty ratio to take account of variations in the signal value storage circuitry 2 and the operation of its detecting and error indicating circuitry.

The error indicating signal err generated by the signal value storage circuitry 2 is supplied to error correction circuitry 34 which performs error correcting operations to compensate for the error arising from the late arrival of the signal transition. These error correcting operations may include, for example, stalling the operation to allow sufficient time for the correct values to settle, resetting the integrated circuit, or some other form of error correction.

Controller circuitry 42 is coupled to the error correction circuitry 40 and serves to vary operating parameters of the integrated circuit 20, such as the operating voltage and/or the operating frequency (frequency of the main clock signal mCK) so as to maintain a finite non-zero rate of errors that are detected and corrected. In this way, the present technique exploits the realisation that the gain achieved by operating at lower voltages and/or higher frequencies more than of sets the losses imposed by having to correct errors when those errors occur sufficiently in frequently.

Figure 10:
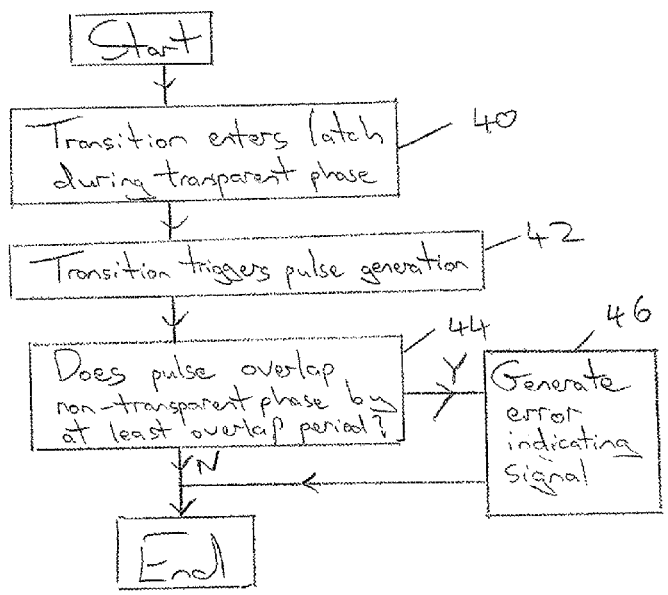
FIG. 10 is a flow diagram schematically illustrating operation of the signal storage circuitry of FIG. 2.

FIG. 10 is a flow diagram schematically illustrating the operation of the signal value storage circuitry of FIG. 2. At step 40, a transition enters the transparent storage circuitry 4. At step 42, this transition triggers generation of a detection pulse DP. Step 44 determines whether or not this detection pulse overlaps the non-transparent phase of the pulse clock signal for at least an overlap period $T_{OV}$. If there is such an overlap, then step 46 serves to generate an error indicating signal. If there is no such overlap, then no error indicating signal is generated.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. Signal value storage circuitry comprising:
   transparent storage circuitry having a signal input and a signal output, said transparent storage circuit controlled by a pulse clock signal:
      (i) during a transparent phase of said pulse clock signal, to transmit a transition in a signal received at said signal input to said signal output via a signal node; and
      (ii) during a non-transparent phase of said pulse clock signal, to block transmission of said transition of said signal through said signal input while maintaining a previously captured signal value at said signal output;
   transition detector circuitry coupled to said signal node within said transparent storage circuitry and configured to generate a detection pulse with a detection pulse width $T_{PW}$ when a signal transition is detected at said signal node; and
   error detecting circuitry coupled to said transition detecting circuitry and configured to generate an error indicating signal when said detection pulse overlaps in time with said non-transparent phase for at least an overlap period $T_{OV}$.

2. Signal value storage circuitry as claimed in claim 1, wherein said transition detector circuitry has a response delay time $T_D$ corresponding to a delay between said transition in said signal passing through said signal input and a start of said detection pulse.

3. Signal value storage circuitry as claimed in claim 2, wherein said transparent phase has a duration $T_T$ equal to or greater than $(T_D+T_{PW}-T_{OV})$.

4. Signal value storage circuitry as claimed in claim 3, wherein, when $T_T$ is greater than $(T_D+T_{PW}-T_{OV})$, said transition in said signal passing through said signal input during a leading dead period $T_B$ of said transparent phase will not result in generation of said error signal, where $T_B$ is given by $(T_T-(T_D+T_{PW}-T_{OV}))$.

5. Signal value detecting circuitry as claimed in claim 1, wherein said transparent storage circuitry comprises a transmission gate disposed at said signal input and switched between a transmissive state and a non-transmissive state by said pulse clock signal.

6. Signal valve storage circuitry as claimed in claim 1, wherein said transparent storage circuitry comprises inverter feedback circuitry disposed between said signal input and said signal output and configured to store said signal received through said signal input and to generate said signal output from said signal output.

7. Signal valve storage circuitry as claimed in claim 1, wherein said transition detector circuitry comprises rising edge detector circuitry configured to generate said detection pulse when a rising edge signal transition is detected at said signal node and falling edge detector circuitry configured to generate said detection pulse when a falling edge signal transition is detected at said signal node.

8. Signal valve storage circuitry as claimed in claim 1, wherein said duration of said transparent phase $T_T$ is less than a duration of said non-transparent phase $T_{NT}$.

9. Signal valve storage circuitry as claimed in claim 1, wherein said error detecting circuitry comprises an error signal node precharged to a first level, said error detection circuitry configured to discharge said error signal node to a second level while said detection pulse is received from said transition detection circuitry during said non-transparent phase.

10. Signal valve storage circuitry as claimed in claim 9, wherein said overlap period corresponds to a time taken for said error signal node to discharge from said first level toward said second level sufficiently to generate said error indicating signal.

11. An integrated circuit comprising at least one signal value storage circuitry as claimed in claim 1 and further comprising error recovery circuitry configured to respond to said error indicating signal to correct an error generated as a consequence of a late transition in said signal received at said signal input.

12. An integrated circuit as claimed in claim 11, comprising controller circuitry configured to control one or more operating parameters of said integrated circuit so as to maintain a finite non-zero rate occurrence of said error indicating signal.

13. An integrated circuit as claimed in claim 11, comprising:
    main clock generating circuitry configured to generated a main clock signal having a main duty ratio of substantially fifty percent; and
    pulse clock generating circuitry coupled to said main clock generating circuitry and configured to generate said pulse clock signal to be synchronous with said main clock signal and with a pulse duty ratio such that said transparent phase has a duration less than said non-transparent phase.

14. An integrated circuit as claimed in claim 13, wherein said transition detector circuitry has a response delay time $T_D$ corresponding to a delay between said transition passing through said signal input and a start of said pulse and further comprising:
    training circuitry configured to vary said pulse duty ratio starting from a value of $T_T$ that is less than $(T_D+T_{PW}-T_{OV})$ and that results in said transition in said signal occurring immediately preceding a start of said transparent phase starts being detected as a false error and then increasing $T_T$ to an operating pulse duty ratio at which said false error no longer arises.

15. An integrated circuit as claimed in claim 13, comprising clock tree circuitry configured to distribute said main clock signal through said integrated circuit and wherein said pulse clock generating circuitry is coupled to said clock tree circuitry and is configured to generate said pulse clock signal from said main clock signal for use by neighbouring signal saving circuitry.

16. An integrated circuit as claimed in claim 15, wherein said pulse clock generating circuitry is combined with clock gating circuitry for stopping said main clock signal supplied to a portion of said integrated circuit.

17. Signal value storage circuitry comprising:
    transparent storage means for storing a signal and having a signal input and a signal output, said transparent storage means controlled by a pulse clock signal:
       (i) during a transparent phase of said pulse clock signal, to transmit a transition in a signal received at said signal input to said signal output via a signal node; and
       (ii) during a non-transparent phase of said pulse clock signal, to block transmission of said transition of said signal through said signal input while maintaining a previously captured signal value at said signal output;

transition detector means, coupled to said signal node within said transparent storage means, for generating a detection pulse with a detection pulse width $T_{PW}$ when a signal transition is detected at said signal node; and error detecting means, coupled to said transition detecting means, for generating an error indicating signal when said detection pulse overlaps in time with said non-transparent phase for at least an overlap period $T_{OV}$.

18. A method of storing a signal value comprising the steps of:

storing a signal within transparent storage circuitry having a signal input and a signal output, said transparent storage means controlled by a pulse clock signal:
  (i) during a transparent phase of said pulse clock signal, to transmit a transition in said signal received at said signal input to said signal output via a signal node; and
  (ii) during a non-transparent phase of said pulse clock signal, to block transmission of said transition of said signal through said signal input while maintaining a previously captured signal value at said signal output;

generating a detection pulse with a detection pulse width $T_{PW}$ when a signal transition is detected at said signal node; and generating an error indicating signal when said detection pulse overlaps in time with said non-transparent phase for at least an overlap period $T_{OV}$.

* * * * *